(12) United States Patent
Chen et al.

(10) Patent No.: US 11,199,466 B2
(45) Date of Patent: Dec. 14, 2021

(54) SYSTEM AND METHOD FOR LIQUID LEAK DETECTION (71) Applicant: TAIWAN SEMICONDUCTOR MANUFACTURING COMPANY, LTD., Hsinchu (TW)

(72) Inventors: Yu Kai Chen, Hsinchu (TW); Chin-Kun Fang, Tainan (TW); Ko-Bin Kao, Taichung (TW); Li-Jen Wu, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 58 days.

(21) Appl. No.: 16/514,155

(22) Filed: Jul. 17, 2019

(65) Prior Publication Data
US 2020/0072696 A1    Mar. 5, 2020

Related U.S. Application Data (60) Provisional application No. 62/725,544, filed on Aug. 31, 2018.

(51) Int. Cl.
*G03F 7/16* (2006.01)
*G01M 3/02* (2006.01)
*H01L 21/67* (2006.01)

(52) U.S. Cl.
CPC ............ *G01M 3/02* (2013.01); *G03F 7/16* (2013.01); *H01L 21/67017* (2013.01)

(58) Field of Classification Search
USPC .... 118/52, 612, 56, 319, 320, 712, 666, 667
See application file for complete search history.

(56) References Cited

U.S. PATENT DOCUMENTS

2004/0165883 A1    8/2004  Nakamura et al.
2006/0134340 A1 *  6/2006  Ishikawa ........... H01L 21/67173
                                                         427/421.1

FOREIGN PATENT DOCUMENTS

| CN | 202074239 U   |   | 12/2011 |            |
|----|---------------|---|---------|------------|
| CN | 103295938 A   |   | 9/2013  |            |
| CN | 105114706     |   | 12/2015 |            |
| CN | 108267269     |   | 7/2018  |            |
| JP | H0667465 B2   |   | 8/1994  |            |
| JP | 11006781 A    | * | 1/1999  |            |
| WO | WO-2018155054 A1 | * | 8/2018 | ........... H01L 21/304 |

OTHER PUBLICATIONS

English Translation WO-2018-155054 (Year: 2018).*
Office Action dated Dec. 11, 2020 for corresponding case No. TW 10921198130. (pp. 1-4).
Office Action dated Sep. 28, 2021 for corresponding case No. CN 201910816909.7 (pp. 1-10).

* cited by examiner

*Primary Examiner* — Yewebdar T Tadesse
(74) *Attorney, Agent, or Firm* — Hauptman Ham, LLP (57) ABSTRACT

A system for detecting leakage of a liquid supply pipe includes a pipe casing for enclosing an end portion of the liquid supply pipe adjoined to a nozzle and a sensor system configured to detect presence of a liquid leaked from the liquid supply pipe at the end portion. The sensor system is in alignment with the end portion of the liquid supply pipe.

13 Claims, 6 Drawing Sheets

SYSTEM AND METHOD FOR LIQUID LEAK DETECTION

BACKGROUND

In the context of integrated circuit (IC) fabrication, a semiconductor wafer is subjected to multiple processes including dispensing a photoresist onto the semiconductor wafer. For a dispensation, the photoresist is supplied to a nozzle through a liquid supply pipe and then dispensed through a discharge outlet of the nozzle. The liquid supply pipe has a double pipe structure with an inner pipe and an outer pipe encircling the inner pipe. The photoresist flows in the inner pipe, and a temperate control liquid, for example water, flows in a space between the inner pipe and the outer pipe. In some embodiments, the outer pipe includes a flexible plastic material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A nozzle is intended to supply a photoresist onto a semiconductor wafer at a dispensing location that is above the semiconductor wafer supported by a spin chuck in a coating unit. Before the photoresist dispensing process, the nozzle is located at a standby location. After a semiconductor wafer is positioned on the spin chuck and secured to the spin chuck, e.g., by vacuum, the nozzle is gripped by a nozzle arm of a nozzle moving device. The nozzle arm pulls the nozzle, together with a liquid supply pipe that is connected to the nozzle, out of the standby location and moves the nozzle to the dispensing location. After the photoresist is dispensed onto the semiconductor wafer through the nozzle, the nozzle is moved back to the standby location by the nozzle moving device.

An end portion of the liquid supply pipe that is immediately adjacent the nozzle is bent when the nozzle is placed at the dispensing location. The repeated pulling of the nozzle back and forth between the standby location and the dispensing location deteriorates the outer pipe of the liquid supply pipe, and eventually results in the rupture of the outer pipe of the liquid supply pipe at the end portion. The temperature control liquid leaked from the ruptured outer pipe tends to splash onto a surface of the semiconductor wafer being processed, causing defects in semiconductor devices formed on the semiconductor wafer. In some approaches, the leakage of the liquid supply pipe is able to be found only after a batch of semiconductor wafers are tested and defects are found on the semiconductor wafers. By this time, many semiconductor wafers have been processed with defects. The production yield is hence adversely affected. Regular manual inspection is performed to check for the pipe rupture, which is laborious and time consuming.

In some embodiments, a leakage detection system for automatically detecting leakage of a liquid supply pipe for supplying a processing liquid to a nozzle in a coating apparatus is provided. The leakage detection system is capable of detecting leakage of the liquid supply pipe throughout the nozzle transporting process when the nozzle is grabbed by a nozzle arm at a standby location, then moved from the standby location to a dispensing location, and eventually stopped at the dispensing location to dispense liquid. To enable the automatic leakage detection, an end portion of the liquid supply pipe adjoined to the nozzle and enclosed by a pipe casing is illuminated by a light source. As the end portion of the liquid supply pipe is ruptured due to repeated pulling, the liquid leaked out from the liquid supply pipe is confined between the pipe casing and the end portion of the liquid supply pipe. Because the liquid between the end portion of the liquid supply pipe and the pipe casing has a refractive index greater than the air when no liquid is present therebetween, an intensity of light refracted by the end portion of the liquid supply pipe increases as the liquid supply pipe starts to leak. After an increase in the intensity of light refracted by the end portion of the liquid supply pipe is observed, which indicates the liquid supply pipe is leaking, the operation of the coating apparatus is stopped to prevent defect formation on a semiconductor wafer being processed. The automatic detection of the leakage of the liquid supply pipe thus helps to improve yield of integrated circuits and reduce manufacturing cost.

Figure 1A:
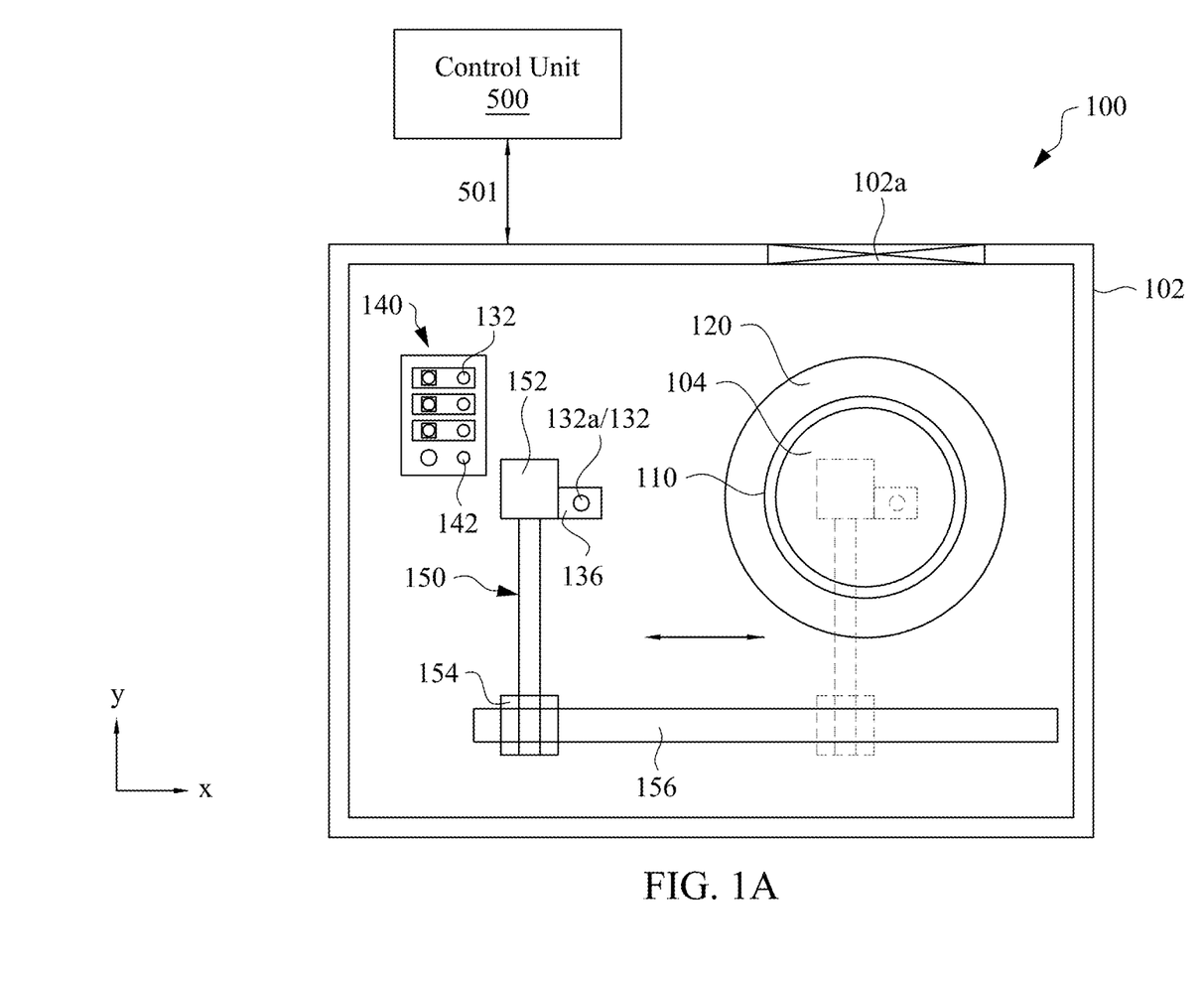
FIG. 1A is a schematic diagram of a coating apparatus, in accordance with some embodiments.
Figure 1B:
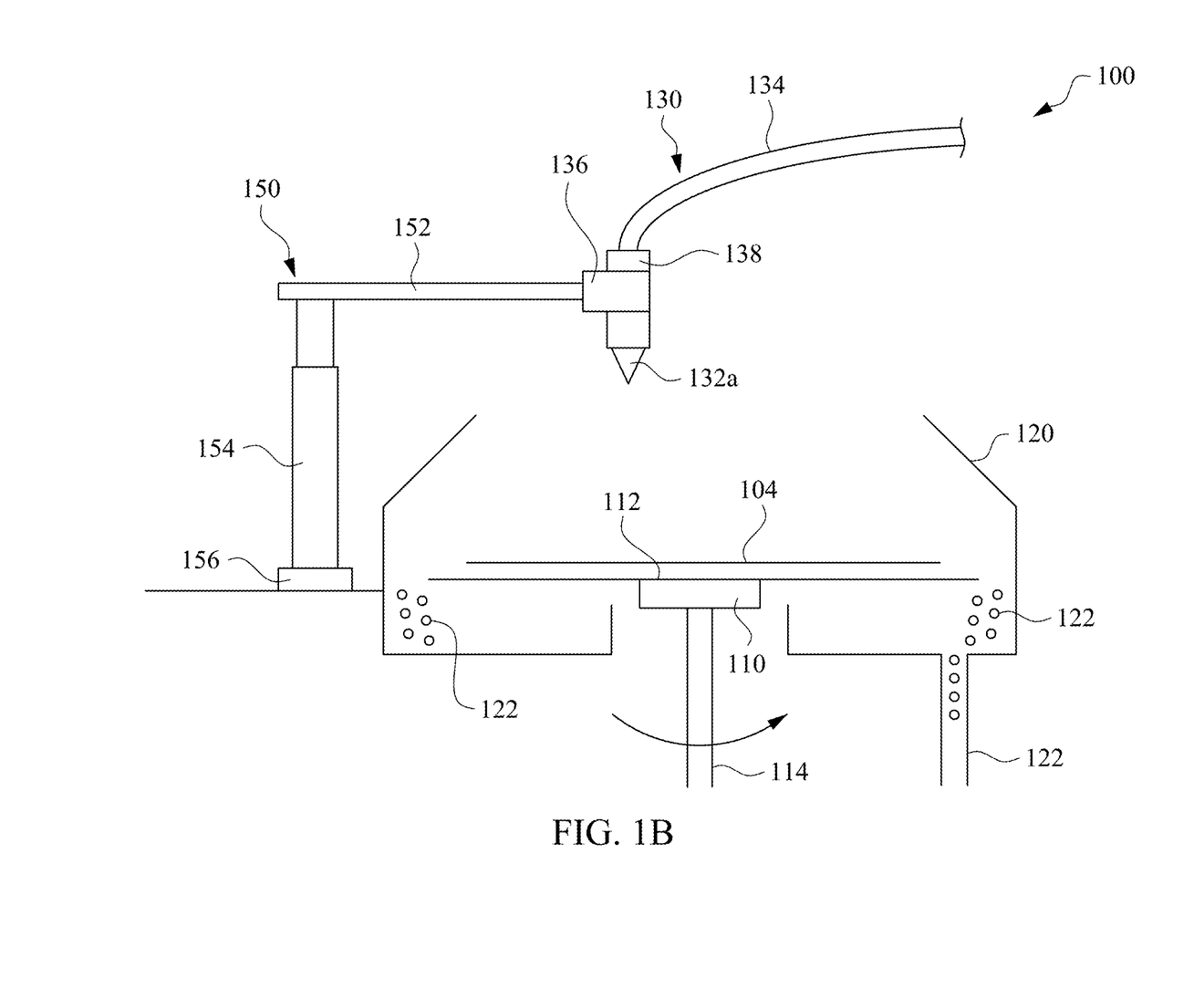
FIG. 1B is a cross-sectional diagram of a coating apparatus, in accordance with some embodiments.

FIGS. 1A and 1B are schematic diagrams of a coating apparatus 100, in accordance with some embodiments. FIG. 1A is a top view of the coating apparatus 100. FIG. 1B is a cross-sectional view of the coating apparatus 100 of FIG. 1A. The coating apparatus 100 is adapted for forming a coating layer on a substrate 104 in a processing chamber 102. The processing chamber 102 provides a space in which substrate processing is performed. An opening 102a is defined in a sidewall of the processing chamber 102 for loading/unloading substrates, e.g., substrate 104, to/from the processing chamber 102.

The coating apparatus 100 includes a spin chuck 110, a drain cup 120, a liquid dispensing system 130 (FIG. 1B), and a nozzle moving device 150. The spin chuck 110, the drain cup 120, the liquid dispensing system 130, and the nozzle moving device 150 are disposed inside the processing chamber 102. The coating apparatus 100 is communicatively coupled with a control unit 500 via a communication link 501. In some embodiments, the communication link 501 is a wireless connection. In some embodiments, the communication link 501 includes one or more connections to communicatively couple the control unit 500 to components of the coating apparatus 100. In some embodiments, the connections are electrical connections. The coating apparatus 100 receives one or more control signals from the control unit 500 and performs coating operations based on the one or more control signals.

The spin chuck 110 is adapted to retain the substrate 104. The substrate 104 is placed on a top surface 112 of the spin chuck 110 and is held in place by, for example, using a vacuum. The spin chuck 110 is operable to rotate the substrate 104 at various speeds during a coating operation. In some embodiments, the substrate 104 is a semiconductor wafer such as, for example, a silicon wafer. The spin chuck 110 is secured on an upper end of a shaft 114, which is rotated by a driving motor (not shown). The rotation of the shaft 114 rotates the spin chuck 110 and the substrate 104 secured thereon.

The drain cup 120 is disposed around a perimeter of the spin chuck 110. The drain cup 120 is capable of being moved up and down so as to surround the substrate 104 and collect excess processing liquid 122 that is cast off the substrate 104 during a coating operation. A drain pipe 124 is connected to a bottom of the drain cup 120. The excess processing liquid 122 collected by the drain cup 120 flows through the drain pipe 124 for recovery in a tank (not shown).

The liquid dispensing system 130 is adapted to dispense processing liquid onto a top surface of the substrate 104 held by the spin chuck 110. The liquid dispensing system 130 includes a plurality of nozzles 132, a nozzle standby unit 140, and the nozzle moving device 150.

Figure 2:
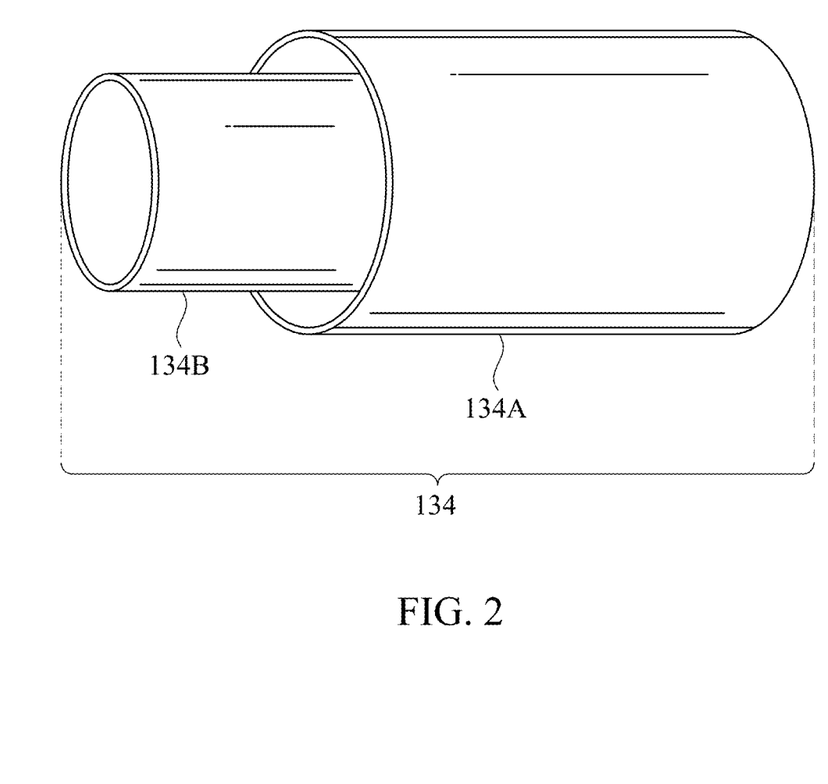
FIG. 2 is a diagram of a portion of a liquid supply pipe in a coating apparatus, in accordance with some embodiments.

The nozzles 132 are used individually according to the types of processing liquids in use. Each nozzle 132 is connected to a corresponding liquid supplier (not shown) through a liquid supply pipe 134, and is usable to discharge one type of processing liquid onto the substrate 104. Each liquid supply pipe 134 is usable to supply a processing liquid to a corresponding nozzle 132. The liquid supply pipe 134 is coupled to a corresponding nozzle 132 via a nozzle holder 136. In some embodiments, at least one liquid supply pipe 134 has a double tube structure including an inner pipe 134A and an outer pipe 134B (FIG. 2). The liquid supply pipe 134 is coupled to a corresponding nozzle holder 136 by a fixing element 138. In some embodiments, a shape of the fixing element 138 is hexagonal or another suitable polygon.

The nozzle standby unit 140 is placed at a location outside of the drain cup 120. The nozzle standby unit 140 is adapted to hold the nozzles 132 at a standby location where the nozzles 132 are not used for processing. The nozzle standby unit 140 includes a plurality of ports 142. At the standby location, discharge outlets of the nozzles 132 are inserted into corresponding ports 142 to expose the discharge outlets of nozzles 132 to a solvent atmosphere, thereby helping to prevent processing liquid at the leading ends of nozzles 132 from being solidified to deteriorate.

The nozzle moving device 150 is configured to select one of the nozzles 132 (for example, nozzle 132a), and move the selected nozzle 132a between the standby location and a dispensing location where the processing liquid is dispensed to the substrate 104 on the spin chuck 110. The nozzle moving device 150 includes a nozzle arm 152, a support member 154, and a guide member 156. Each nozzle 132 is able to be removably attached to a leading end of the nozzle arm 152 through the nozzle holder 136. The nozzle arm 152 is mounted at the upper end portion of the support member 154. To move the selected nozzle 132a between the standby location and the dispensing location, the support member 154 is configured to be movable along the guide member 156 in an X direction by an X-direction driving device (not shown), so that the nozzle arm 152 held by the support member 154 is movable between the standby location and the dispensing location. In some embodiments, the X-direction is a horizontal direction. In some embodiments, the guide member 156 is a guide rail. To be able to select one of the nozzles 132, e.g., nozzle 132a, held by the nozzle standby unit 140, the support member 154 is also configured to be movable in a Y-direction by a Y-direction driving device (not shown). In some embodiments, the Y-direction is perpendicular to the X-direction. In some embodiments, the Y-direction is a vertical direction. In some embodiments, the X-direction and Y-direction driving devices are motors and are controlled by the control unit 500.

During a coating operation, a substrate 104 is first loaded onto the spin chuck 110 and is held on the spin chuck 110, e.g., by vacuum suction. The nozzle arm 152 then selects one of the nozzles 132, e.g., nozzle 132a, disposed at the nozzle standby unit 140 and moves the selected nozzle 132a from the standby location to the dispensing location (illustrated in FIG. 1A by the arrow line). After the nozzle arm 152 moves the selected nozzle 132a above the substrate 104, the selected nozzle 132a applies a predetermined amount of a processing liquid to the center of the substrate 104. In some embodiments, the nozzle arm 152 moves the selected nozzle 132a above a center of the substrate 104. The spin chuck 110 then spins to spread out the processing liquid to cover the top surface of the substrate 104. Excess processing liquid 122 that is thrown off the surface of the substrate 104 and collected by the drain cup 120 is drained away by the drain pipe 124. After dispensing the processing liquid onto the top surface of the substrate 104, the nozzle arm 152 moves the selected nozzle 132a back to the standby location. An end portion of the liquid supply pipe 134 that is adjacent the fixing element 138 is bent when the nozzle 132a is placed at the dispensing location by the nozzle arm 152. Repeated bending of the end portion of the liquid supply pipe 134 increases a risk of rupture of the liquid supply pipe 134 at the end portion, and fluidic leakage from the ruptured end portion of the liquid supply pipe 134.

FIG. 2 is a diagram of a portion of a liquid supply pipe 134, in accordance with some embodiments. Referring to FIG. 2, the liquid supply pipe 134 includes an inner pipe 134A and an outer pipe 134B encircling the inner pipe 134A.

The outer pipe 134B is spaced apart from the inner pipe 134A, with a ring-shaped space therebetween. A processing liquid flows in the inner pipe 134A and a temperature control liquid flows in the space between the inner pipe 134A and the outer pipe 134B. In some embodiments, the processing liquid is a photoresist and the temperature control liquid is water.

In some embodiments, the inner pipe 134A is formed of a material that is inert to the processing liquid. In some embodiments, the inner pipe 134A includes perfluoroalkoxy or polytetrafluoroethylene. In some embodiments, the outer pipe 134A is made of a flexible material such as, for example, polytetrafluoroethylene. Due to bending strains, after a prolonged use, the outer pipe 134B has an increased risk of rupture, resulting in leakage of the temperature control liquid.

Figure 3:
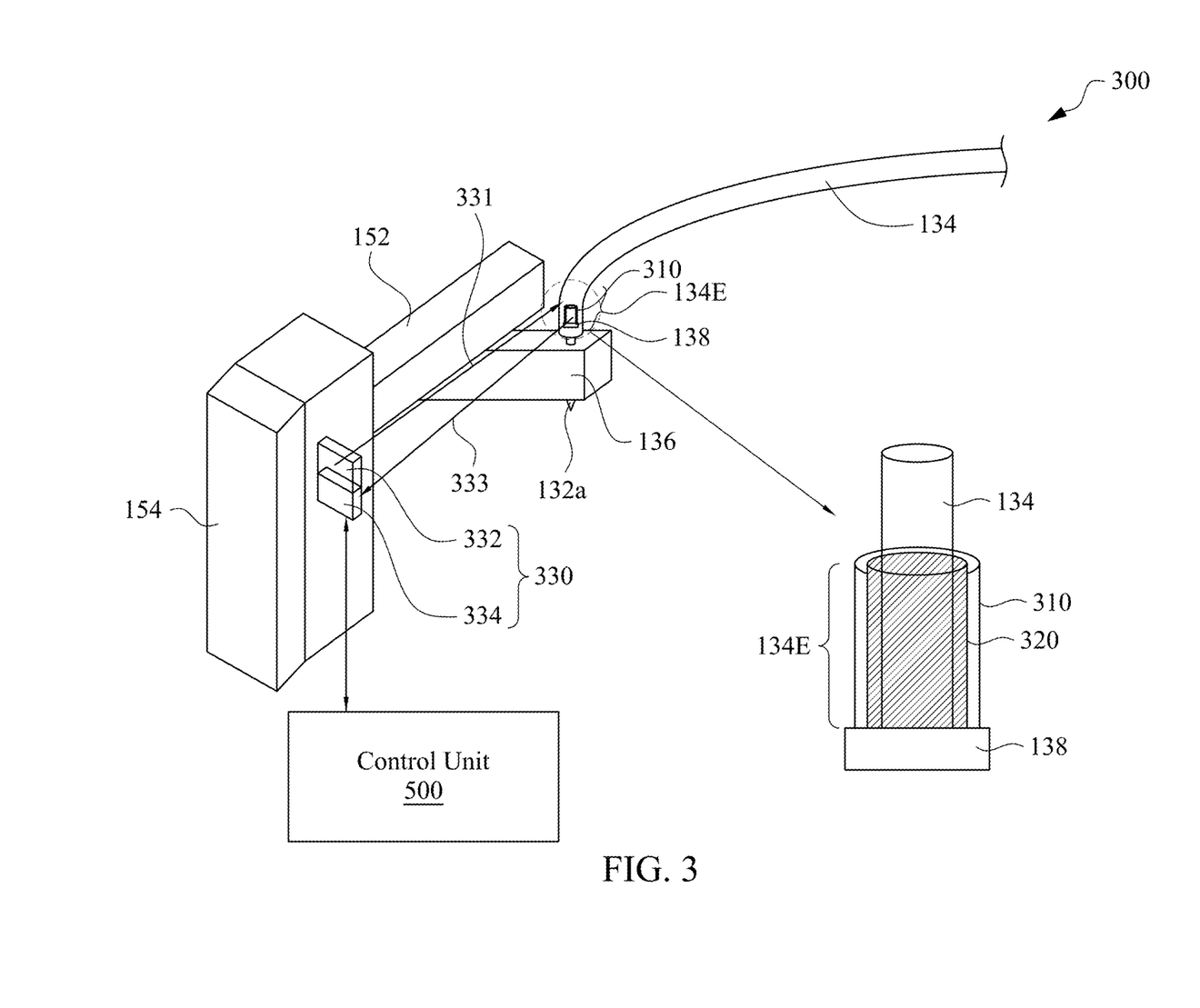
FIG. 3 is a diagram of a leakage detection system for automatically detecting leakage of a liquid supply pipe, in accordance with some embodiments.

FIG. 3 is a perspective view of a leakage detection system 300, in accordance with some embodiments. The leakage detection system 300 is integrated with a coating apparatus 100 of FIG. 1 and is configured to automatically detect leakage of a liquid supply pipe 134 before the dispensing of a processing liquid starts.

The leakage detection system 300 includes a pipe casing 310 enclosing an end portion 134E of the liquid supply pipe 134 that is adjoined to a corresponding nozzle 132, e.g., nozzle 132a, a liquid absorbing paper 320 interposed between the pipe casing 310 and the end portion 134E of the liquid supply pipe 134, and a sensor system 330 on a sidewall of a support member 154 of a nozzle moving device 150.

The pipe casing 310 has a tubular shape configured to enclose an entire exterior circumference of the end portion 134E of the liquid supply pipe 134. Accordingly, after the outer pipe 134B of the liquid supply pipe 134 is ruptured at the end portion 134E, the liquid (e.g., the temperature control liquid) which leaks out of the ruptured outer pipe 134B is able to be confined between the pipe casing 310 and the outer pipe 134B and to flow downwardly along the liquid supply pipe 134. The pipe casing 310 thus is usable to define a leakage detection region and to prevent the leaked liquid from splashing onto the substrate 104. As a result, possible damage to the substrate 104 caused by splashing of the leaked liquid onto the substrate 104 is reduced or avoided. The pipe casing 310 is made of a flexible material such as a fluoropolymer. In some embodiments, the pipe casing 310 is made of polytetrafluoroethylene. The thickness of the pipe casing is selected such that the flexibility of the liquid supply pipe 134 is not adversely affected by the presence of the pipe casing 310. In some embodiments, the pipe casing 310 has a thickness less than 0.2 millimeter (mm). If the thickness of the pipe casing 310 is too great, the pipe casing 310 becomes too rigid to sustain the bending associated with the end portion 134E of the liquid supply pipe 134.

The liquid absorbing paper 320 wraps around the end portion 134E of the liquid supply pipe 134. The liquid absorbing paper 320 is capable of absorbing the leaked liquid and increasing an intensity of light detected by the sensor system 330. In some embodiments, the liquid absorbing paper 320 is configured to have a first light transmission rate when the liquid absorbing paper 320 is dry and to have a second light transmission rate that is different from the first transmission rate when the liquid absorbing paper 320 absorbs the leaked liquid and becomes wet. In some embodiments, the second light transmission rate is less than the first light transmission rate. For example, the liquid absorbing paper is transparent initially and becomes opaque after the liquid absorbing paper 320 absorbs the liquid leaked from the liquid supply pipe 134. The liquid absorbing paper 320 thus helps to improve the detection sensitivity of the sensor system 330. In some embodiments, the liquid absorbing paper 320 is dust free paper.

The sensor system 330 is configured to detect leakage of the liquid supply pipe 134. In instances where the liquid supply pipe 134 includes an inner pipe 134A for transporting a processing liquid and an outer pipe 134B for transporting a temperature control liquid, the sensor system 330 is configured to detect the leakage of the temperature control liquid after the outer pipe 134B is ruptured. The sensor system 330 is disposed on a sidewall of the support member 154 and is movable along with the nozzle moving device 150. The sensor system 330 is in alignment with the end portion 134E of the liquid supply pipe 134 as the liquid supply pipe 134 is moved from the standby location to the dispensing location along with the nozzle 132a. The sensor system 330 is capable of emitting light 331 towards the end portion 134E of the liquid supply pipe 134 and detecting light 333 refracted from the end portion 134E of the liquid supply pipe 134. The sensor system 330 includes a light source 332 capable of directing light 331 to the end portion 134E of the liquid supply pipe 134, and a light detector 334 capable of detecting light 333 refracted from the end portion 134E of the liquid supply pipe. In some embodiments, the sensor system 330 includes one or more additional components (not shown) capable of performing one or more additional functions related to the leakage detection operation including, but not limited to, data storage, signal processing, and communication with the control unit 500.

The light source 332 is configured to emit light 331 in a wavelength range to which the processing liquid flowed in the liquid supply pipe 134 is not reactive, so that the leakage detection operation does not cause degradation of the processing liquid. For example, in instances where the processing liquid is a photoresist, the light source 332 does not emit in a wavelength range between 193 nm and 365 nm. In some embodiments, the light source 332 is a visible light source. In some embodiments, the light source 332 is an infrared (IR) light source. In some embodiments, the light source 332 emits light 331 with a peak wavelength about 630 nm. In some embodiments, the light source 332 includes a laser diode, a light emitting diode, or other suitable light sources. In some embodiments, the light source 332 includes an integral lens or is combined with an external lens configured to focus light 331 onto the end portion 134E of the liquid supply pipe 134.

The light detector 334 is configured to detect light 333 refracted by the end portion 134E of the liquid supply pipe 134 and generate a signal based on the detected light 333. In some embodiments, the signal represents an intensity of light 333. As the end portion 134E of the liquid supply pipe 134 ruptures which in turn results in the leakage of the liquid, e.g., the temperature control liquid, from the liquid supply pipe 134, the leaked liquid tends to refract more light 331 that is incident on the end portion 134E of the liquid supply pipe 134. The intensity of light 333 detected by the light detector 334 thus is higher than the light intensity detected when no liquid is leaked from the liquid supply pipe 134. In some embodiments, the light detector 334 is sensitive to visible light. In some embodiments, the light detector 334 is sensitive to IR light.

Light source 332 and light detector 334 are coupled to the control unit 500 via a communication link 503. In some embodiments, the communication link 503 is a wireless connection. In some embodiments, the communication link 501 includes one or more wires to electrically couple the control unit 500 to the sensor system 330. The control unit 500 is configured to provide a control signal causing the light source 332 to emit light 331 at a predetermined power and a wavelength, and receives signals from light detector 334 indicative intensities of the detected light 333 refracted by the end portion 134E of the liquid supply pipe 134. The control unit 500 is also configured to monitor whether an intensity of light 333 refracted by the end portion 134E of the liquid supply pipe 134 has risen above an intensity threshold. If a determination is made that the intensity of light 333 refracted by the end portion 134E of the liquid supply pipe 134 has risen above the intensity threshold, which indicates the end portion 134E of the liquid supply pipe 134 is broken and the liquid is leaking from the end portion 134E of the liquid supply pipe 134, the control unit 500 generates an output signal to cause the coating operation to stop. In some embodiments, the control unit 500 also generates an output signal to trigger an alarm (not shown), so that a user or an operator is informed of the leak and take measures to replace the liquid supply pipe 134. In some embodiments, the alarm is an audible alarm. In some embodiments, the alarm is a visible alarm.

Figure 4:
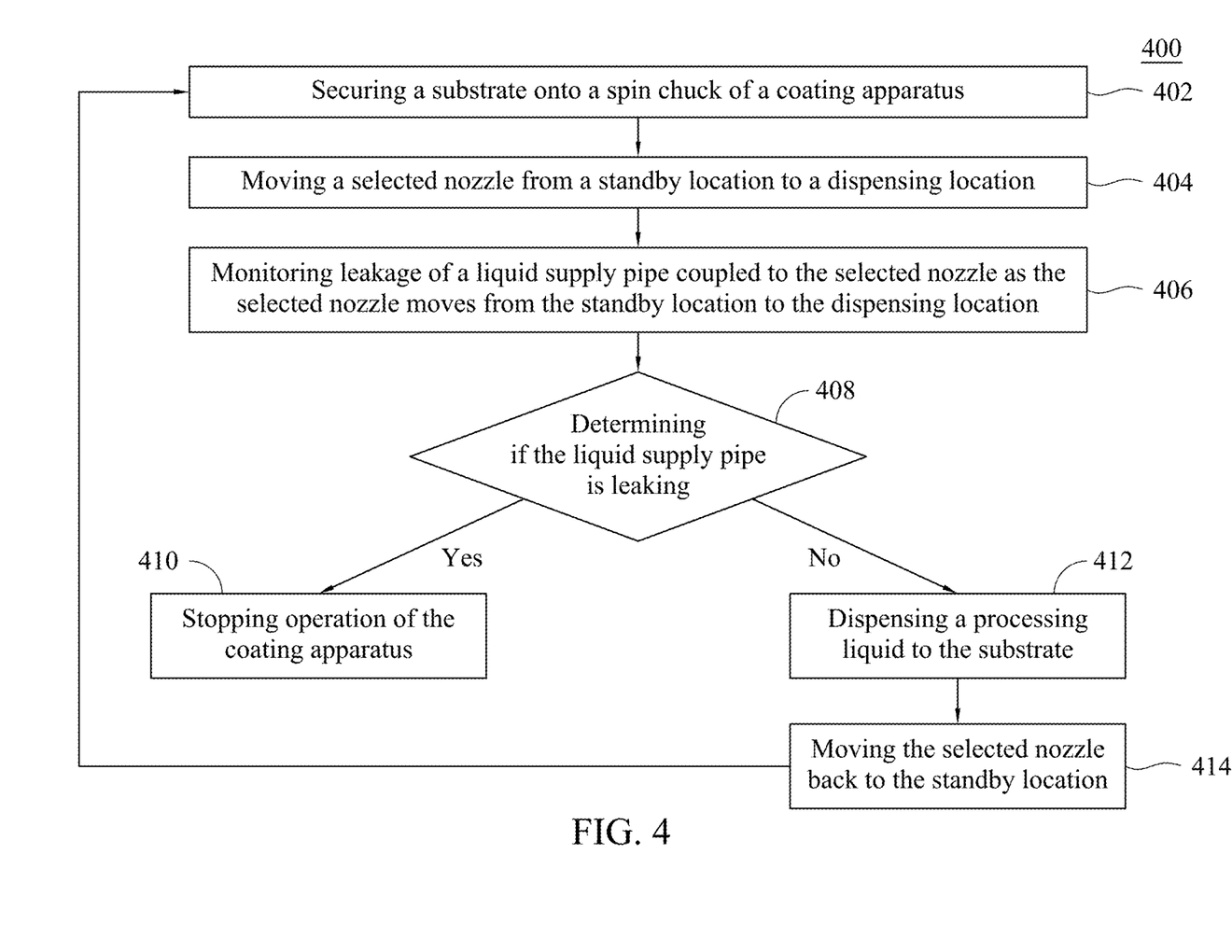
FIG. 4 is a flowchart of a method for automatically detecting leakage of a liquid supply pipe, in accordance with some embodiments.

FIG. 4 is flowchart of a method 400 for automatically detecting leakage of a liquid supply pipe 134 connected to a nozzle 132 in a coating apparatus 100 (FIG. 1), in accordance with some embodiments. The method 400 is implemented using a leakage detection system, e.g., leakage detection system 300 discussed above with respect to FIG. 3. One or more components of the coating apparatus 100 and the leakage detection system 300 is/are controlled by a control unit 500 (FIG. 5) to perform the method 400.

The method 400 includes operation 402, in which a substrate 104, e.g., a semiconductor wafer, is loaded onto a spin chuck 110 of the coating apparatus 100 and secured onto the spin chuck 110, e.g., by vacuum.

In operation 404, a nozzle arm 152 in a nozzle moving device 150 of the coating apparatus 100 grabs one of nozzles 132, e.g., nozzle 132a, that are disposed in a nozzle standby unit 140 at a standby location, and starts to move the selected nozzle 132a from the standby location towards a dispensing location that is above a center of the substrate 104. The selected nozzle 132a is moved along a guide member 156 of the nozzle moving device 150.

In operation 406, leakage of a liquid supply pipe 134 that is coupled to the selected nozzle 132a is monitored as the selected nozzle 132a is moved from the standby location to the dispensing location using the leakage detection system 300. In some embodiments, the leakage of the liquid supply pipe 134 is monitored based on measurements of intensity values of light, e.g., light 333, received by a light detector such as light detector 334 in the leakage detection system 300.

In some embodiments, the leakage of the liquid supply pipe 134 is monitored during the movement of the selected nozzle 132a. After the substrate 104 is secured onto the spin chuck 100 and the nozzle arm 152 grabs a selected nozzle 132a from the nozzle standby unit 140, operation of a sensor system 330 that is attached to a sidewall of a support member 154 of the nozzle moving device 150 and thus is capable of moving along with the selected nozzle 132a is triggered. As the selected nozzle 132a is moved from the standby location to the dispensing location, a light source 332 in the sensor system 330 emits light 331 towards an end portion 134E of a liquid supply pipe 134 and a light detector 334 detects light 333 refracted by the end portion 134E of the liquid supply pipe 134. To facilitate the leakage detection, the end portion 134E of the liquid supply pipe 134 is enclosed by a pipe casing 310. A liquid absorbing paper 320 is interposed between the pipe casing 310 and the end portion 134E of the liquid supply pipe 134, in some embodiments. In some embodiments, the light source 332 continuously emits light 331 to the end portion 134E of the liquid supply pipe 134, and light 333 refracted by the end portion 134E of the liquid supply pipe 134 is continuously measured by the light detector 334 as the selected nozzle assembly 130a is moved from the standby location to the dispensing location. In some embodiments, the light source 332 periodically emits light 331 to the end portion 134E of the liquid supply pipe 134, and light 333 refracted by the end portion 134E of the liquid supply pipe 134 is periodically measured by the light detector 334 as the selected nozzle assembly 130a is moved from the standby location to the dispensing location.

In operation 408, a determination is made if the liquid supply pipe 134 is leaking. In some embodiments, determining if the liquid supply pipe 134 is leaking includes comparing an intensity of light 333 detected by the light detector 334 to a predetermined intensity threshold. In some embodiments, the intensity threshold is an empirically determined threshold value related to an intensity of the detected light 333 that is refracted by the end portion 134E of the liquid supply pipe 134 when no liquid is present between the pipe casing 310 and the end portion 134E of the liquid supply pipe 134.

If an intensity of light 333 detected by the light detector 334 is above the intensity threshold, which indicates liquid is present between the pipe casing 310 and the end portion 134E of the liquid supply pipe 134 and the liquid supply pipe 134 is leaking, the method proceeds to operation 410, in which the control unit 500 sends a control signal to the coating apparatus 100 to stop the liquid dispensing process, thus helps to minimize the adverse effect caused by the leakage and helps to prevent a lot of substrates from being ruined in other approaches when the leakage is not detected timely. In some embodiments, the control unit 500 also sends a control signal to trigger an alarm so that a user or an operator is informed of the leak and takes measures to replace the broken pipe.

If an intensity of light 333 detected by the light detector 334 is below the intensity threshold, which indicates no liquid is present between the pipe casing 310 and the end portion 134E of the liquid supply pipe 134 and the liquid supply pipe 134 is not leaking, the method 400 process to operation 412, in which the coating operation continues. The processing liquid is dropped from a discharge outlet of the nozzle 132 to the center of the substrate 104 and is coated onto the substrate surface as the substrate 104 is spun by the spin chuck 110.

In operation 414, after the substrate 104 is coated with a layer of a processing material, the nozzle arm 152 moves the selected nozzle 132a back to the standby location.

Figure 5:
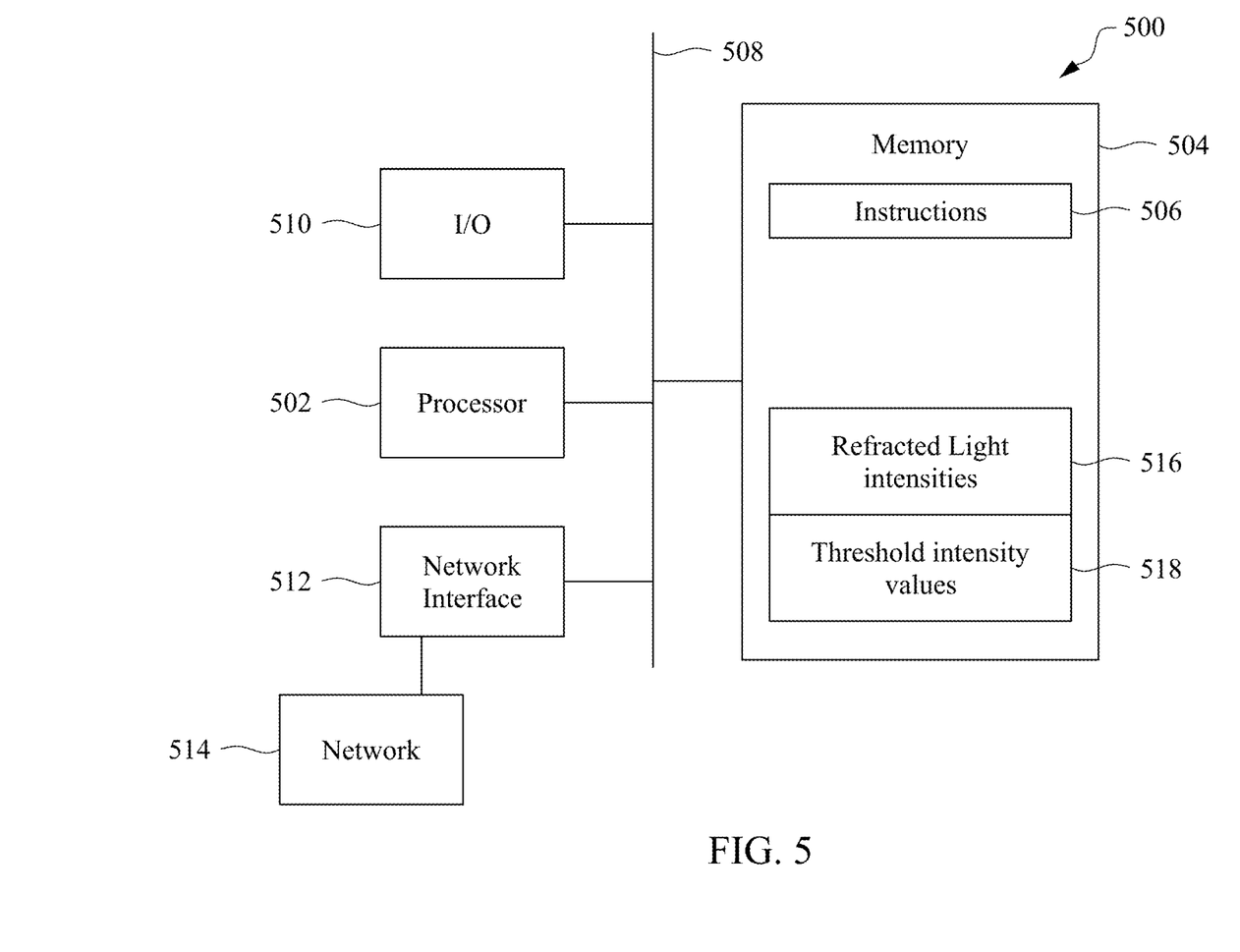
FIG. 5 is a block diagram of a control unit for controlling operation of a leakage detection system.

FIG. 5 is a block diagram of a control unit 500 for controlling operations of a coating apparatus 100 and a leakage detection system 300 that is integrated with the coating apparatus 100, in accordance with some embodiments.

In some embodiments, the control unit 500 is a general purpose computing device including a hardware processor 502 and a non-transitory, computer readable storage medium 504 encoded with, i.e., storing, the computer program code, i.e., a set of executable instructions 506. The computer readable storage medium 504 is also encoded with instructions 506 for interfacing with components of the coating apparatus 100 and the leakage detection system 300, e.g., spin chuck 110, nozzles 132, nozzle moving device 150, and sensor system 330. The processor 502 is electrically coupled to the computer readable storage medium 504 via a bus 508. The processor 502 is also electrically coupled to an I/O interface 510 by bus 508. A network interface 512 is also electrically connected to the processor 502 via a bus 508. The network interface 512 is connected to a network 514, so that processor 502 and computer readable storage medium 504 are capable of connecting to external elements via network 514. The processor 502 is configured to execute the computer program instructions 506 encoded in the computer readable storage medium 504 in order to cause the control unit 500 to be usable for performing a portion or all of the operations as described in the method 400.

In some embodiments, the processor 502 is a central processing unit (CPU), a multi-processor, a distributed processing system, an application specific integrated circuit (ASIC), and/or a suitable processing unit.

In some embodiments, the computer readable storage medium 504 is an electronic, magnetic, optical, electromagnetic, infrared, and/or a semiconductor system (or apparatus or device). For example, the computer readable storage medium 504 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 504 includes a compact disk-read only memory (CD-ROM), a compact disk-read/write (CD-R/W), and/or a digital video disc (DVD).

In some embodiments, the computer readable storage medium 504 stores the computer program instructions 506 configured to cause the control unit 500 to perform a portion or all of the method 400. In some embodiments, the computer readable storage medium 504 also stores information needed for performing the method 500 as well as information generated during the performance of the method 400, such as sensor parameters 516 including refractive light intensities measured by sensor system 330 and one or more threshold intensity values 518, and/or a set of executable instructions to perform one or more operations of the method 400.

In some embodiments, the computer readable storage medium 504 stores computer program instructions 506 for interfacing with the coating apparatus 100. The computer program instructions 506 enable the processor 502 to generate operating instructions readable by the spin chuck 110, the nozzles 132, the nozzle moving device 150, and the sensor system 330 to effectively implement the operations as described with respect to the coating apparatus 100 and the leakage detection system 330.

The control unit 500 includes I/O interface 510. The I/O interface 510 is coupled to external circuitry. In some embodiments, the I/O interface 510 includes a keyboard, keypad, mouse, trackball, trackpad, and/or cursor direction keys for communicating information and commands to the processor 502.

The control unit 500 also includes network interface 512 coupled to the processor 502. The network interface 512 allows the control unit 500 to communicate with the network 514, to which one or more other computer systems are connected. The network interface 512 includes wireless network interfaces such as BLUETOOTH, WIFI, WIMAX, GPRS, or WCDMA; or wired network interface such as ETHERNET, USB, or IEEE-1394. In some embodiments, the operations as described with respect to the method 400 are implemented in two or more control units 500, and information such as refracted light intensities and one or more threshold intensity values, are exchanged between different control units 500 via network 514.

The control unit 500 is configure to receive information related to determine leakage of a liquid supply pipe 134 that is connected to a nozzle 132 in a coating apparatus 100 usable for performing a coating operation. The information is transferred to the processor 502 via bus 608 and is then stored in computer readable storage medium 504 as one or more sensor parameters 516 and/or threshold intensity values 518. In some embodiments, the sensor parameters 516 and the threshold intensity values 518 are accessed and compared in operation 408 (FIG. 4).

By being configured to execute a portion or all of method 400, the control unit 500 enables the realization of the advantages discussed above with respect to the leakage detection system 300 and method 400.

One aspect of this description relates to a system for detecting leakage of a liquid supply pipe. The system includes a pipe casing for enclosing an end portion of the liquid supply pipe adjoined to a nozzle and a sensor system configured to detect presence of a liquid leaked from the liquid supply pipe at the end portion. The sensor system is in alignment with the end portion of the liquid supply pipe. In some embodiments, the pipe casing has a thickness less than 0.2 mm. In some embodiments, the system further includes a liquid absorbing paper interposed between the pipe casing and the end portion of the liquid supply pipe. In some embodiments, the liquid absorbing paper is configured to have a first light transmission rate when the liquid absorbing paper is dry and a second light transmission rate that is different from the first light transmission rate after the liquid absorbing paper absorbs the liquid leaked from the liquid supply pipe. In some embodiments, the nozzle is coupled to a first end of a nozzle arm of a nozzle moving device, wherein the nozzle moving device is configured to move the nozzle from a standby location to a dispensing location in a coating operation. In some embodiments, the sensor system is on a sidewall of a support member coupled to a second end of the nozzle arm opposite the first end. In some embodiments, the sensor system includes a light source configured to emit light to the end portion of the liquid supply pipe and a light detector configured to detect light refracted by the end portion of the liquid supply pipe.

Another aspect of this description relates to an apparatus. The apparatus includes a coating apparatus having a nozzle configured to dispense a processing liquid onto a surface of a substrate, a liquid supply pipe coupled to the nozzle and configured to supply the processing liquid to the nozzle, and a nozzle moving device configured to move the nozzle from a standby location to a dispensing location where dispensing of the processing liquid onto the surface of the substrate occurs. The nozzle moving device includes a nozzle arm, a support member, and a guide member. The nozzle arm is coupled to a first end of the nozzle arm. A second end of the nozzle arm that is opposite the first end is mounted on an upper portion of the support member. The guide member is configured to guide movement of the support member from the standby location to the dispensing location. The apparatus further includes a system configured to automatically detect leakage of the liquid supply pipe. The system includes a pipe casing enclosing an end portion of the liquid supply pipe adjoined to the nozzle, a liquid absorbing paper interposed between the pipe casing and the end portion of the liquid supply pipe, and a sensor system on a sidewall of the support member and configured to detect the leakage of the liquid supply pipe. In some embodiments, the sensor system includes a light source configured to emit light to the end portion of the liquid supply pipe and a light detector configured to detect light refracted by the end portion of the liquid supply pipe. In some embodiments, the light source is configured to emit light at a wavelength range to which the processing liquid is not reactive. In some embodiments, the light source is an infrared light source. In some embodiments, the light detector is an infrared light detector. In some embodiments, the liquid supply pipe includes an inner pipe configured to flow the processing liquid, and an outer pipe enclosing the inner pipe and configured to flow a temperature control liquid. The sensor system detects leakage of the temperature control liquid. In some embodiments, the outer pipe includes polytetrafluoroethylene. In some embodiments, the pipe casing wraps around the liquid supply pipe. In some embodiments, the liquid absorbing paper is a dust free paper.

Still another aspect of this description relates to a method for detecting leakage of a liquid supply pipe. The method includes moving a nozzle from a standby location to a dispensing location. The nozzle is connected to the liquid supply pipe and is configured to dispense a processing liquid to a surface of a substrate, and an end portion of the liquid supply pipe adjoined to the nozzle is covered with a pipe casing. The method further includes illuminating the end portion of the liquid supply pipe with a light beam as the nozzle is moved from the standby location to the dispensing location. The method further includes measuring an intensity of a light beam refracted by the end portion of the liquid supply pipe. In some embodiments, the method further includes determining whether the intensity of the light beam refracted by the end portion of the liquid supply pipe is above an intensity threshold, which indicates the liquid supply pipe is leaking. In some embodiments, the method further includes terminating dispensing of the processing liquid if the intensity of the light beam refracted by the end portion of the liquid supply pipe is above the intensity threshold. In some embodiments, the method further includes triggering an alarm if the intensity of the light beam refracted by the end portion of the liquid supply pipe is above the intensity threshold.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
    a coating apparatus comprising:
        a nozzle configured to dispense a processing liquid onto a surface of a substrate;
        a liquid supply pipe coupled to the nozzle and configured to supply the processing liquid to the nozzle; and
        a nozzle moving device configured to move the nozzle from a standby location to a dispensing location where dispensing of the processing liquid onto the surface of the substrate occurs, wherein the nozzle moving device comprises:
            a nozzle arm, wherein the nozzle is coupled to a first end of the nozzle arm;
            a support member, wherein a second end of the nozzle arm, opposite the first end, is mounted on an upper portion of the support member; and
            a guide member, wherein the guide member is configured to guide movement of the support member from the standby location to the dispensing location; and
    a system configured to automatically detect leakage of the liquid supply pipe, the system comprises:
        a pipe casing enclosing an end portion of the liquid supply pipe adjoined to the nozzle;
        a liquid absorbing paper interposed between the pipe casing and the end portion of the liquid supply pipe; and
        a sensor system on a sidewall of the support member and configured to detect the leakage of the liquid supply pipe.

2. The apparatus of claim 1, wherein the sensor system comprises a light source configured to emit light to the end portion of the liquid supply pipe and a light detector configured to detect light refracted by the end portion of the liquid supply pipe.

3. The apparatus of claim 2, wherein the light source is configured to emit light at a wavelength range to which the processing liquid is not reactive.

4. The apparatus of claim 2, wherein the light source is an infrared light source.

5. The apparatus of claim 2, where the light detector is an infrared light detector.

6. The apparatus of claim 1, wherein the liquid supply pipe comprises an inner pipe configured to flow the processing liquid, and an outer pipe enclosing the inner pipe and configured to flow a temperature control liquid, wherein the sensor system detects leakage of the temperature control liquid.

7. The apparatus of claim 6, wherein the outer pipe comprises polytetrafluoroethylene.

8. The apparatus of claim 1, wherein the pipe casing wraps around the liquid supply pipe.

9. The apparatus of claim 1, wherein the liquid absorbing paper is a dust free paper.

10. An apparatus, comprising:
    a coating apparatus comprising:
        a nozzle configured to dispense a processing liquid onto a surface of a substrate;
        a liquid supply pipe coupled to the nozzle and configured to supply the processing liquid to the nozzle; and
        a nozzle moving device configured to move the nozzle from a standby location to a dispensing location where dispensing of the processing liquid onto the surface of the substrate occurs, wherein the nozzle moving device comprises:
            a nozzle arm, wherein the nozzle is coupled to a first end of the nozzle arm;
            a support member, wherein a second end of the nozzle arm, opposite the first end, is mounted on an upper portion of the support member; and
            a guide member, wherein the guide member is configured to guide movement of the support member from the standby location to the dispensing location; and
    a system configured to automatically detect leakage of the liquid supply pipe, the system comprises:

a pipe casing enclosing an end portion of the liquid supply pipe adjoined to the nozzle;

a liquid absorbing paper interposed between the pipe casing and the end portion of the liquid supply pipe; and a sensor system configured to detect presence of a liquid leaked from the liquid supply pipe at the end portion, wherein the sensor system is in alignment with the end portion of the liquid supply pipe upstream of the nozzle.

11. The apparatus of claim 10, wherein the sensor system is configured to emit light to the end portion of the liquid supply pipe and to detect light refracted by the end portion of the liquid supply pipe.

12. The apparatus of claim 10, wherein the liquid absorbing paper is configured to have a first light transmission rate when the liquid absorbing paper is dry and a second light transmission rate, different from the first light transmission rate, when the liquid absorbing paper absorbs the processing liquid.

13. The apparatus of claim 10, wherein the sensor system on a sidewall of the support member.

\* \* \* \* \*